US009640528B2

(12) United States Patent
Preisler et al.

(10) Patent No.: US 9,640,528 B2
(45) Date of Patent: May 2, 2017

(54) LOW-COST COMPLEMENTARY BICMOS INTEGRATION SCHEME

(71) Applicant: Newport Fab, LLC, Newport Beach, CA (US)

(72) Inventors: Edward Preisler, San Clemente, CA (US); Todd Thibeault, Irvine, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 14/659,882

(22) Filed: Mar. 17, 2015

(65) Prior Publication Data

US 2015/0303185 A1 Oct. 22, 2015

Related U.S. Application Data

(60) Provisional application No. 61/980,185, filed on Apr. 16, 2014.

(51) Int. Cl.
| | |
|---|---|
| *H01L 27/06* | (2006.01) |
| *H01L 21/8249* | (2006.01) |
| *H01L 29/417* | (2006.01) |
| *H01L 27/102* | (2006.01) |
| *H01L 29/165* | (2006.01) |

(52) U.S. Cl.
CPC ...... *H01L 27/0623* (2013.01); *H01L 21/8249* (2013.01); *H01L 27/102* (2013.01); *H01L 27/1022* (2013.01); *H01L 29/165* (2013.01); *H01L 29/41708* (2013.01)

(58) Field of Classification Search
CPC ............... H01L 27/0623; H01L 27/102; H01L 27/1022; H01L 21/8249
See application file for complete search history.

(56) References Cited

U.S. PATENT DOCUMENTS

| | | | |
|---|---|---|---|
| 5,342,794 A | * | 8/1994 | Wei .................... H01L 21/8249 148/DIG. 11 |
| 5,930,635 A | | 7/1999 | Bashir |
| 6,830,967 B1 | | 12/2004 | Yin |
| 6,933,202 B1 | | 8/2005 | Hurwitz |
| 7,335,547 B1 | | 2/2008 | U'Ren |
| 2005/0054170 A1 | | 3/2005 | Steinmann |
| 2007/0013031 A1 | | 1/2007 | Gray |
| 2007/0134854 A1 | | 6/2007 | Zhang |
| 2008/0227262 A1 | | 9/2008 | El-Kareh |
| 2008/0316659 A1 | | 12/2008 | Oguzman |

(Continued)

*Primary Examiner* — Phat X Cao
(74) *Attorney, Agent, or Firm* — Farjami & Farjami LLP

(57) ABSTRACT

A bipolar complementary-metal-oxide-semiconductor (BiCMOS) device is disclosed. The BiCMOS device includes a CMOS device in a CMOS region, a first CMOS well in the CMOS region, an NPN bipolar device in a bipolar region, a second CMOS well in the bipolar region, the second CMOS well being a collector sinker and being electrically connected to a sub-collector of the NPN bipolar device, where the first CMOS well in the CMOS region and the second CMOS well in the bipolar region form a p-n junction to provide electrical isolation between the CMOS device and the NPN bipolar device. The BiCMOS device further includes a PNP bipolar device having a sub-collector, the sub-collector of the PNP bipolar device being electrically connected to a third CMOS well.

18 Claims, 8 Drawing Sheets

(56) References Cited

U.S. PATENT DOCUMENTS

2010/0019326 A1    1/2010   Knoll
2010/0032766 A1    2/2010   Chen
2012/0018811 A1    1/2012   Yeh

* cited by examiner

US 9,640,528 B2

LOW-COST COMPLEMENTARY BICMOS INTEGRATION SCHEME

The present application claims the benefit of and priority to a provisional patent application entitled "Low-Cost Complementary BiCMOS Integration Scheme", Ser. No. 61/980,185 filed on Apr. 16, 2014. The disclosure in this provisional application is hereby incorporated fully by reference into the present application.

BACKGROUND

In complementary bipolar complementary-metal-oxide semiconductor (BiCMOS) fabrication processes, bipolar devices and complementary-metal-oxide-semiconductor (CMOS) devices are integrated on the same semiconductor substrate. High performance bipolar devices, such as NPN and PNP silicon-germanium (SiGe) bipolar transistors, require a high mask count when integrated on the same semiconductor substrate as the CMOS devices. As BiCMOS technology continues to advance in an effort to achieve high performance, such as increased speed, frequency response and gain, and reduced power consumption, semiconductor manufacturers are challenged to provide a complementary BiCMOS process that effectively integrates higher performing bipolar and CMOS devices.

In one approach of complementary BiCMOS process flow, when forming a bipolar device, a buried sub-collector layer is formed below and in contact with a collector region and away from a top surface of a semiconductor substrate. A collector sinker extends from the top surface of the semiconductor substrate down to the buried sub-collector layer. The buried sub-collector layer and the collector sinker may provide an electrical pathway from the collector to a collector contact for external connection. However, the formations of the buried sub-collector layers for the NPN and PNP devices require several implanting steps and masking layers. The formations of the collector sinkers for the NPN and PNP devices also require separate implanting steps and masking layers. These steps in the complementary BiCMOS process flow undesirably add to processing complexity and manufacturing cost. Also, deep trench isolation regions may be required to provide electrical isolation for bipolar devices from other devices, such as CMOS devices, fabricated on the semiconductor substrate. The deep trench isolation regions unavoidably occupy the limited usable space on the semiconductor substrate.

Thus, there is a need in the art for a complementary BiCMOS process for effectively integrating complementary bipolar devices, such as SiGe NPN and PNP devices, with CMOS devices without undesirably increasing processing complexity and manufacturing cost.

SUMMARY

The present disclosure is directed to a low-cost complementary BiCMOS integration scheme, substantially as shown in and/or described in connection with at least one of the figures, and as set forth in the claims.

DESCRIPTION OF EXEMPLARY IMPLEMENTATIONS

Figure 1:
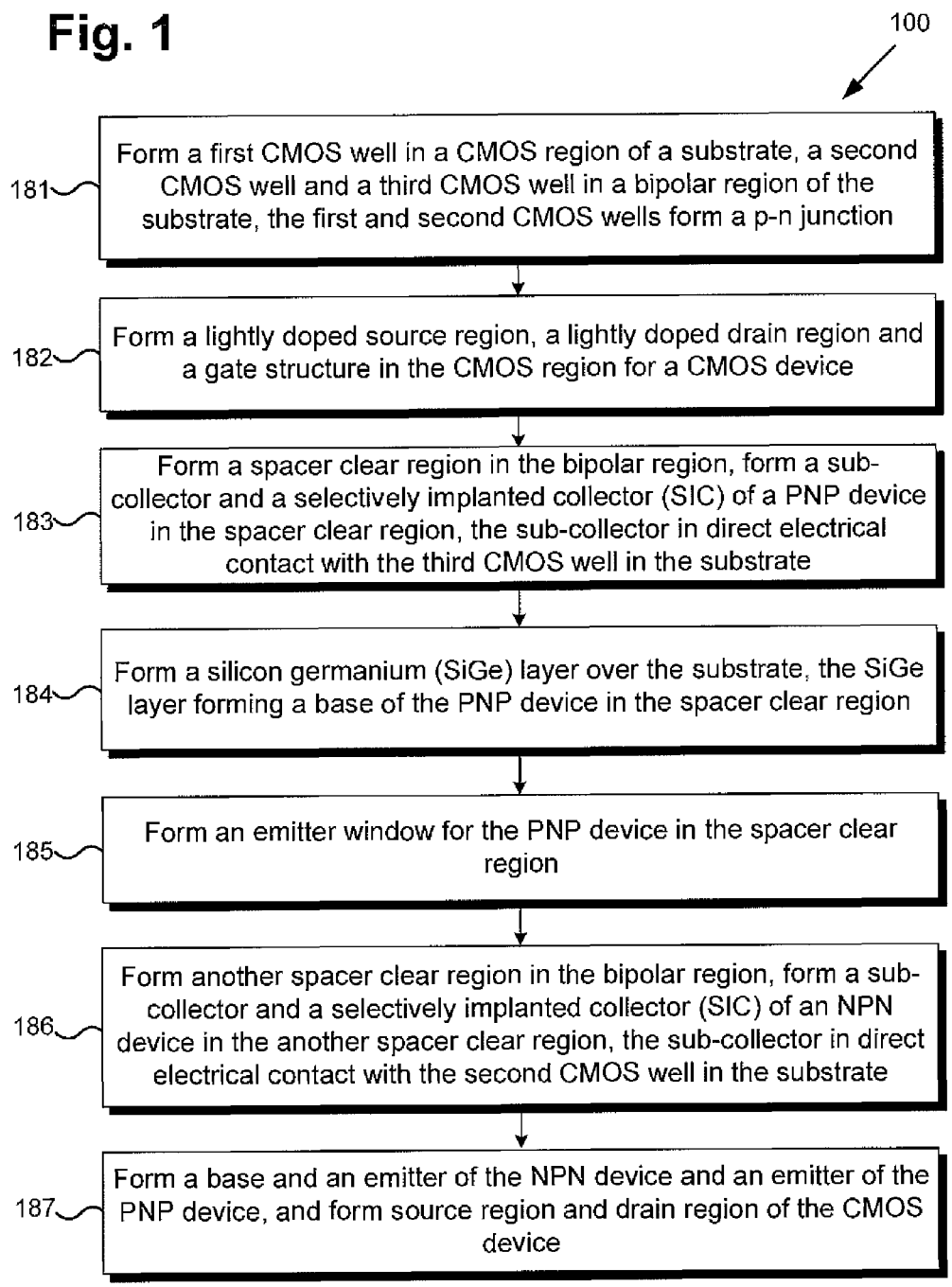
FIG. 1 is a flowchart illustrating a method for fabricating a bipolar complementary-metal-oxide-semiconductor (BiCMOS) device according to one implementation of the present application.

The following description contains specific information pertaining to implementations in the present disclosure. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 shows an exemplary diagram illustrating an exemplary method for fabricating a bipolar complementary-metal-oxide-semiconductor (BiCMOS) device, according to one implementation of the present inventive concepts. Certain details and features have been left out of flowchart 100 that are apparent to a person of ordinary skill in the art. For example, an action may comprise one or more sub actions or may involve specialized equipment or materials, as is known in the art. While actions 181 through 187 indicated in flowchart 100 are sufficient to describe one implementation disclosed herein, other implementations disclosed herein may use actions different from those shown in flowchart 100.

As illustrated in flowchart 100, action 181 includes forming a first CMOS well in a CMOS region of a substrate, a second CMOS well and a third CMOS well in a bipolar region of the substrate, where the first and second CMOS wells form a p-n junction. Action 182 includes forming a lightly doped source region, a lightly doped drain region, and a gate structure in the CMOS region for a CMOS device. Action 183 includes forming a spacer clear region in the bipolar region, and forming a sub-collector, and a selectively implanted collector (SIC) (also known and referred to in the art simply as a "collector") of a PNP device in the spacer clear region, where the sub-collector is in direct electrical contact with the third CMOS well in the substrate. Action 184 includes forming a silicon germanium (SiGe) layer over the substrate, the SiGe layer forming a base of the PNP device in the spacer clear region. Action 185 includes forming an emitter window for the PNP device in the spacer clear region. Action 186 includes forming another spacer clear region in the bipolar region, and forming a sub-collector, and a selectively implanted collector (SIC) (also known and referred to in the art simply as a "collector") of an NPN device in the another spacer clear region, where the sub-collector is in direct electrical contact with the second CMOS well in the substrate. Action 187 includes forming a base and an emitter of the NPN device and an emitter of the PNP device, and forming source region and drain region of the CMOS device.

Figure 2A:
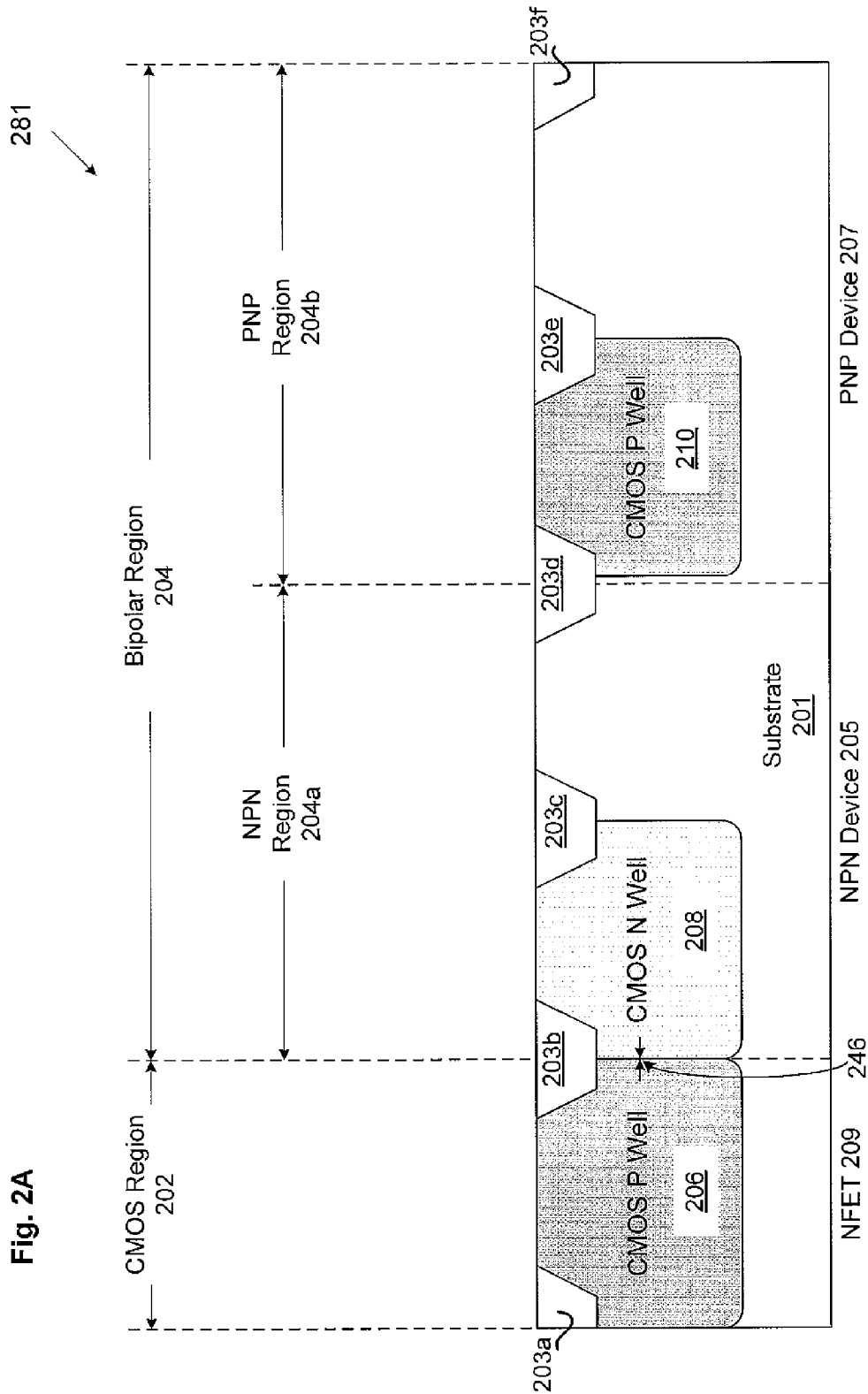
FIG. 2A illustrates a cross-sectional view of a portion of a semiconductor structure processed in accordance with an initial action in the flowchart of FIG. 1 according to one implementation of the present application.
Figure 2B:
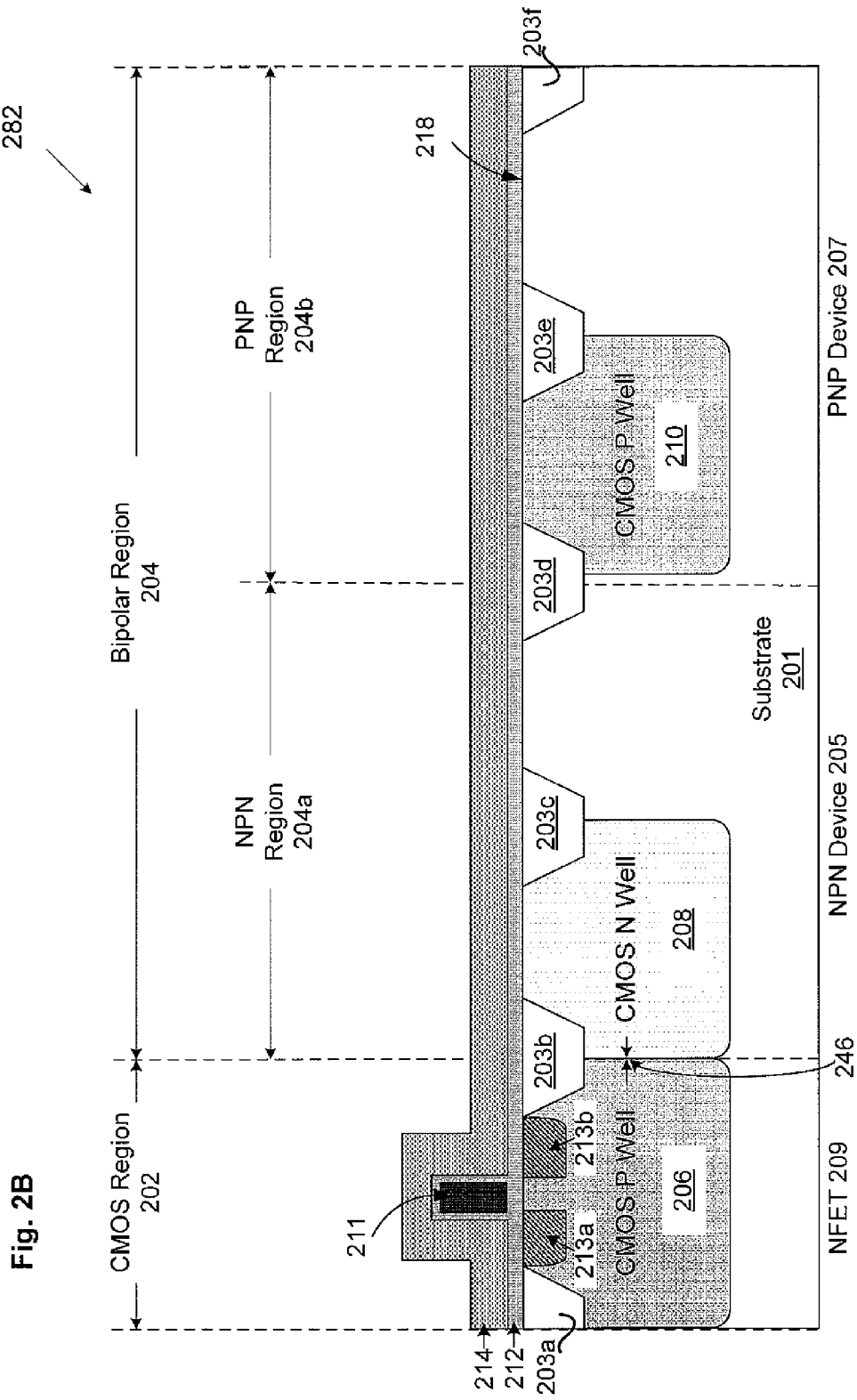
FIG. 2B illustrates a cross-sectional view of a portion of a semiconductor structure processed in accordance with an intermediate action in the flowchart of FIG. 1 according to one implementation of the present application.
Figure 2C:
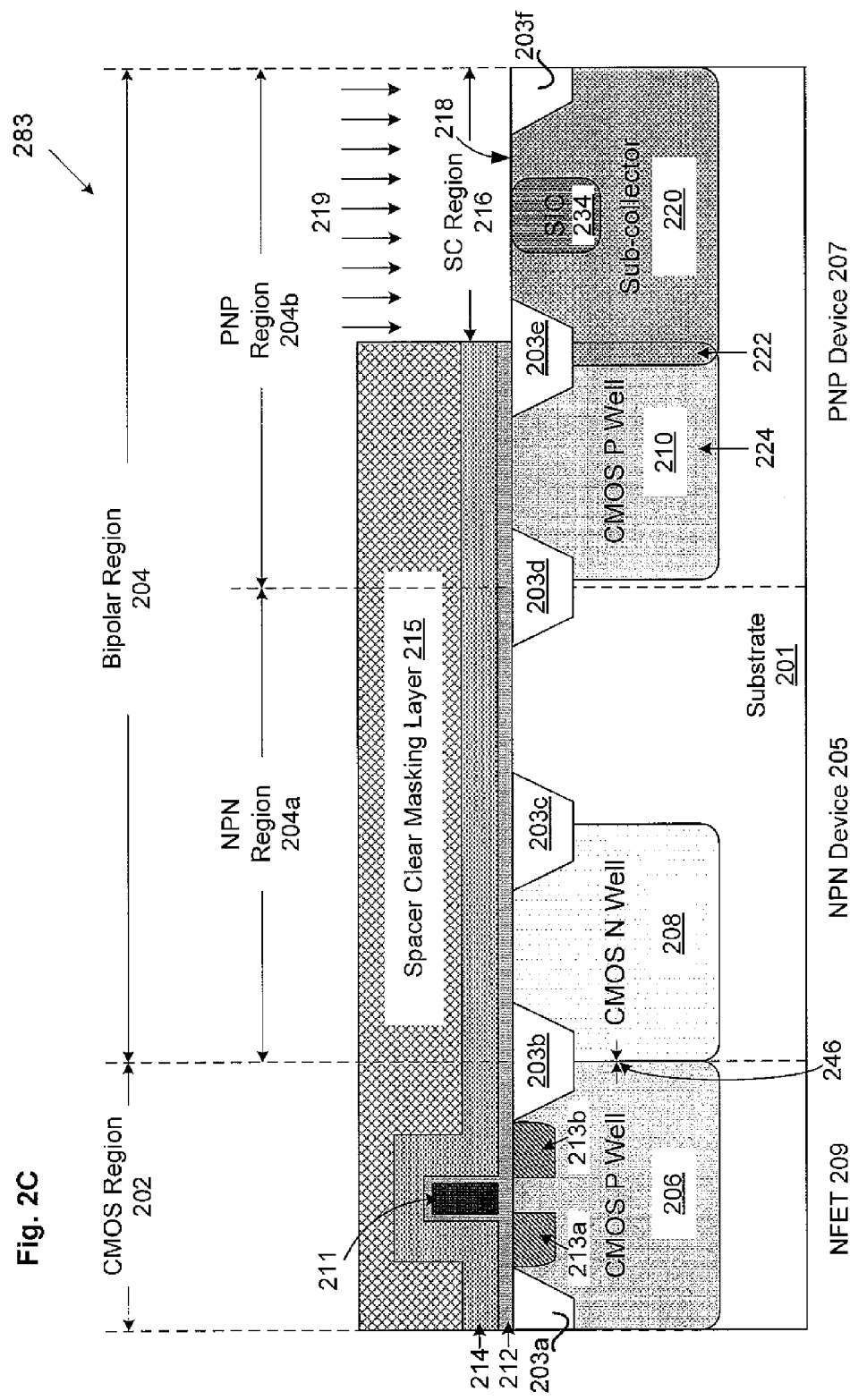
FIG. 2C illustrates a cross-sectional view of a portion of a semiconductor structure processed in accordance with an intermediate action in the flowchart of FIG. 1 according to one implementation of the present application.
Figure 2D:
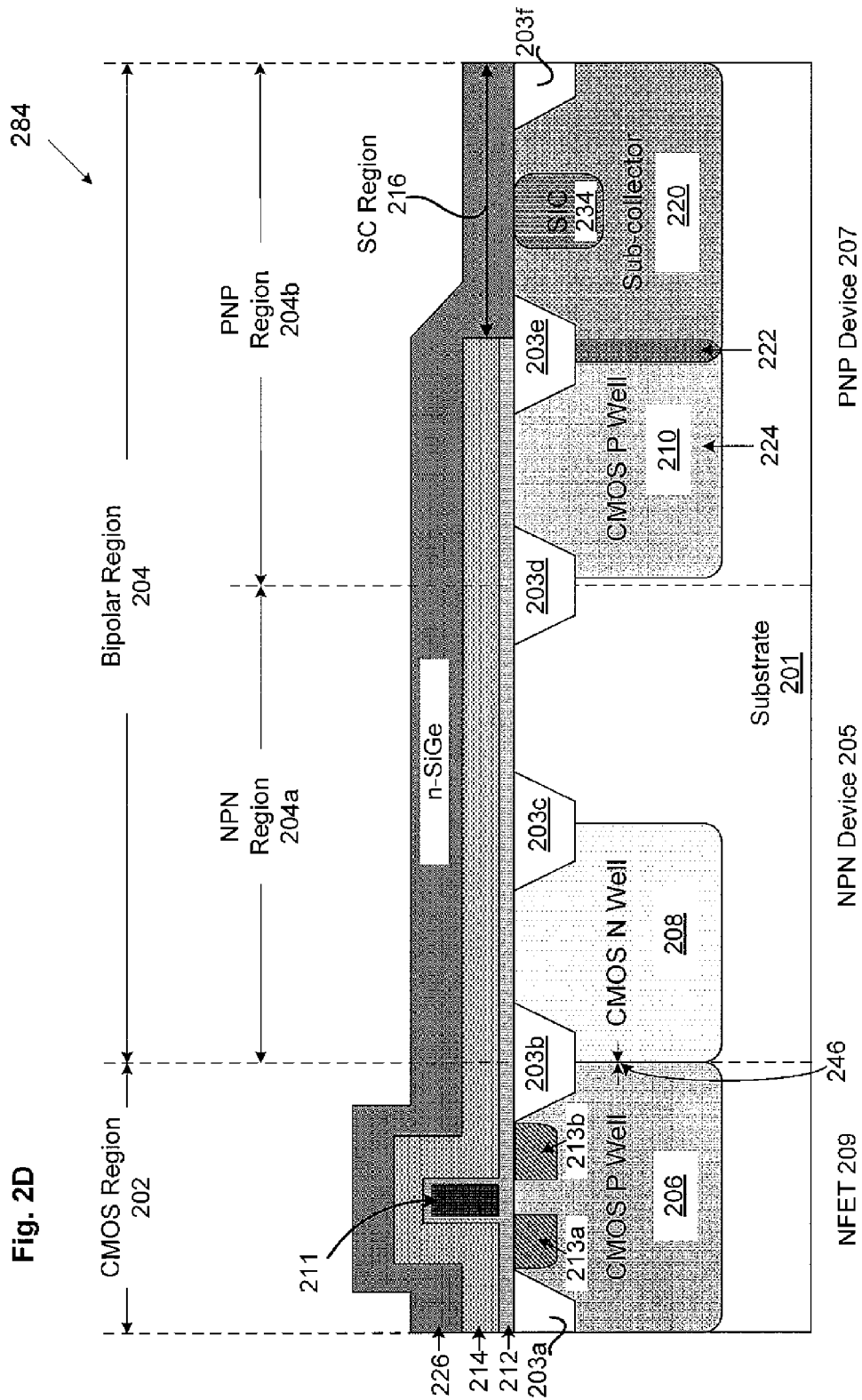
FIG. 2D illustrates a cross-sectional view of a portion of a semiconductor structure processed in accordance with an intermediate action in the flowchart of FIG. 1 according to one implementation of the present application.
Figure 2E:
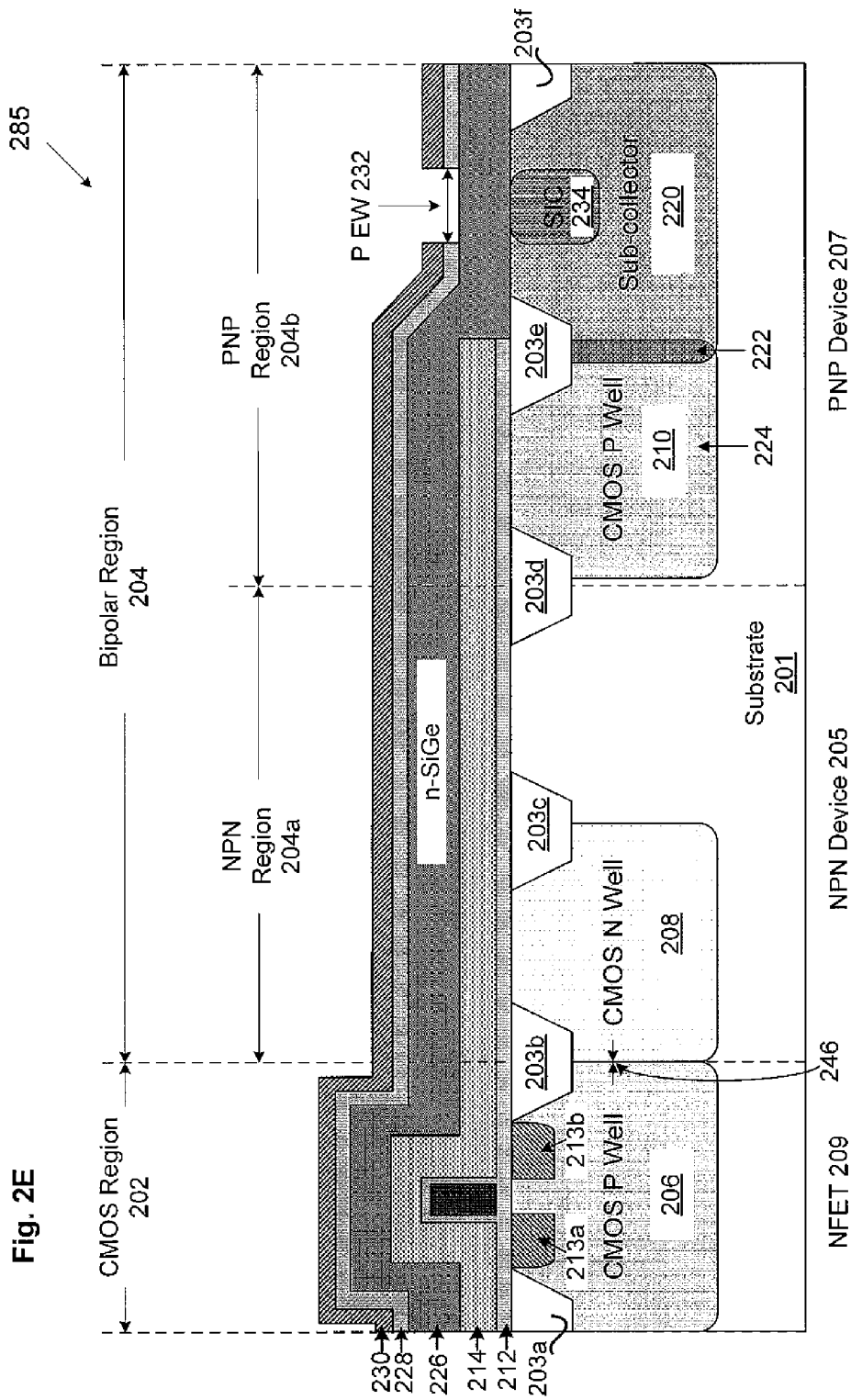
FIG. 2E illustrates a cross-sectional view of a portion of a semiconductor structure processed in accordance with an intermediate action in the flowchart of FIG. 1 according to one implementation of the present application.
Figure 2F:
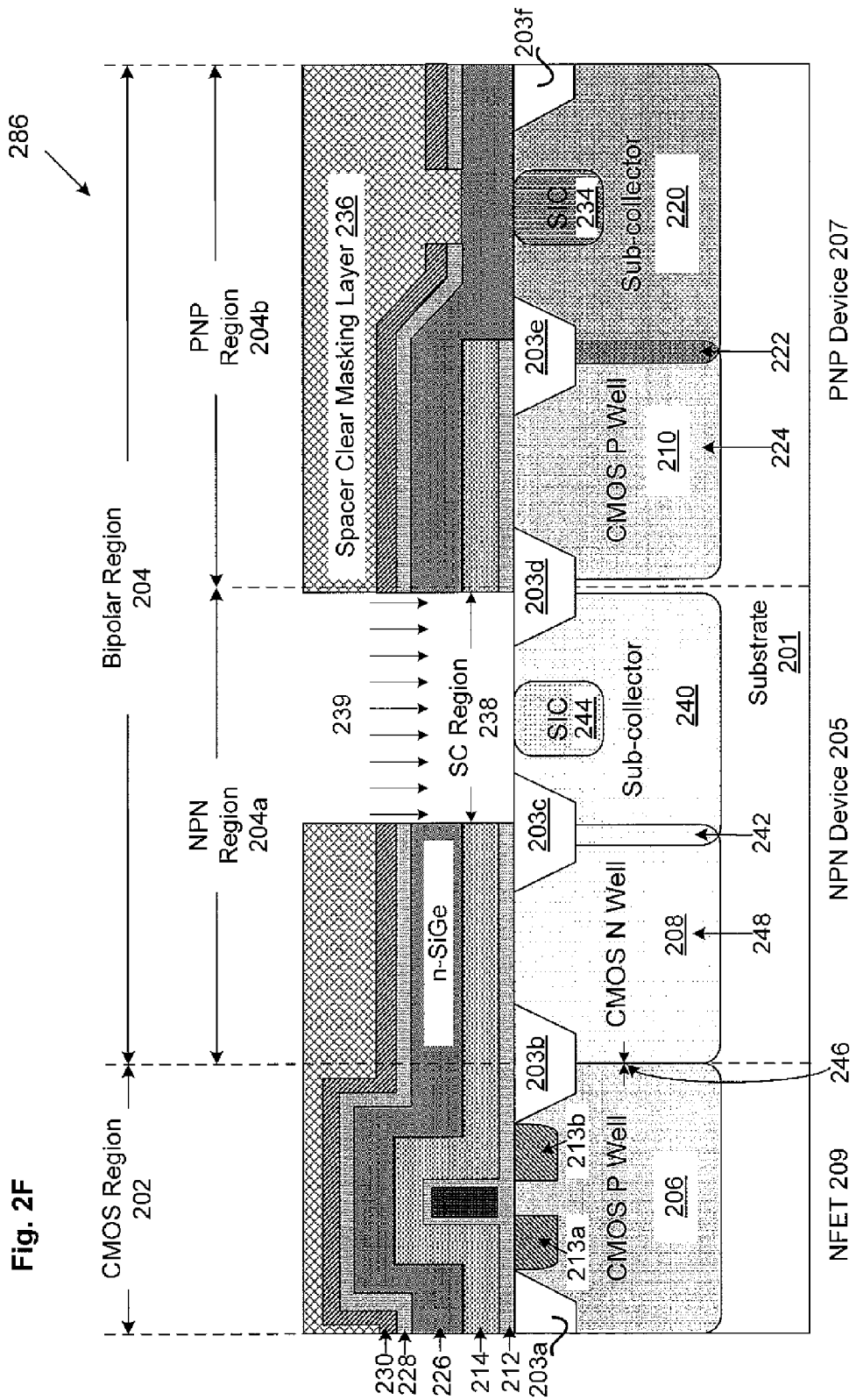
FIG. 2F illustrates a cross-sectional view of a portion of a semiconductor structure processed in accordance with an intermediate action in the flowchart of FIG. 1 according to one implementation of the present application.
Figure 2G:
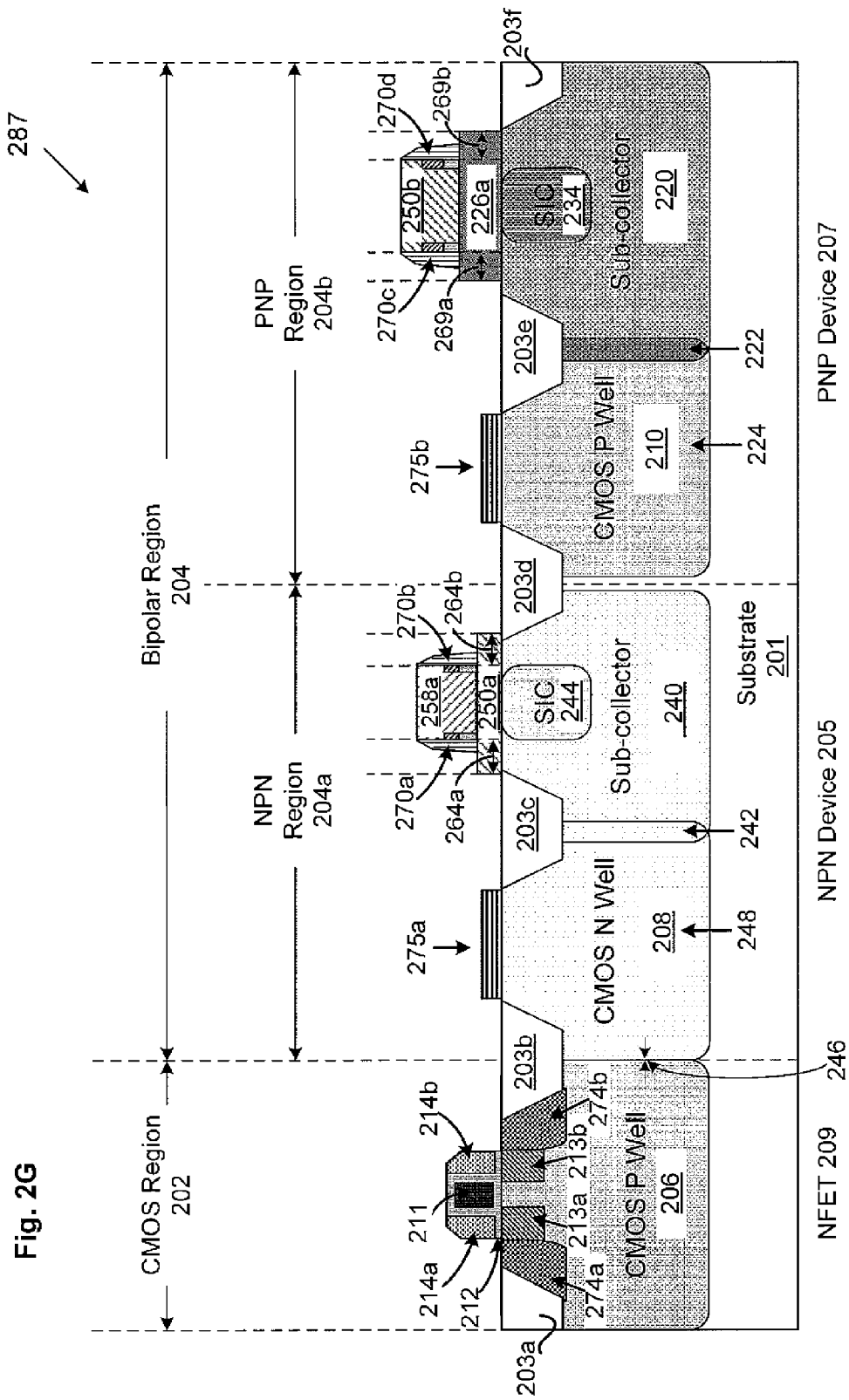
FIG. 2G illustrates a cross-sectional view of a portion of a semiconductor structure processed in accordance with a final action in the flowchart of FIG. 1 according to one implementation of the present application.

FIGS. 2A through 2G and structures 281 through 287 illustrate the result of performing actions 181 through 187 of flowchart 100 of FIG. 1, respectively, according to one implementation of the present disclosure. For example, structure 281 shows a semiconductor structure after action 181, structure 282 shows structure 281 after action 182, structure 283 shows structure 282 after action 183, and so forth. FIG. 2G illustrates a cross-sectional view of a portion of a semiconductor structure processed in accordance with final action 187 in flowchart 100 of FIG. 1, according to one implementation of the present disclosure.

Referring to FIG. 2A, structure 281 illustrates a cross-sectional view of a portion of a semiconductor device after completion of action 181 in flowchart 100 of FIG. 1, according to one implementation of the present disclosure. As shown in FIG. 2A, structure 281 includes semiconductor substrate 201, CMOS P well 206, CMOS N well 208, CMOS P well 210, and isolation regions 203a, 203b, 203c, 203d, 203e and 203f. Semiconductor substrate 201 may include a lightly doped P type silicon or other appropriate substrate material. Isolation regions 203a, 203b, 203c, 203d, 203e and 203f are situated in semiconductor substrate 201, and may include field oxide, such as silicon oxide. Isolation regions 203a, 203b, 203c, 203d, 203e and 203f can include shallow trench isolation (STI) regions, and can be formed in any manner known in the art.

As illustrated in FIG. 2A, CMOS P well 206, CMOS N well 208 and CMOS P well 210 are formed in semiconductor substrate 201 in CMOS region 202, NPN region 204a and PNP region 204b, respectively. For example, CMOS P wells 206 and 210 can be formed by utilizing a well mask to define respective portions of semiconductor substrate 201 in CMOS region 202 and bipolar region 204, and implanting boron or other appropriate P type dopant in the defined portions of semiconductor substrate 201. Thus, CMOS P well 210 in PNP region 204b can be formed at the same time, using the same well mask and the same type dopant as other CMOS P wells, such as CMOS P well 206, in CMOS region 202. In one implementation, CMOS P wells 206 and 210 may include a heavily doped P type implant. As discussed below, CMOS P well 206 can be utilized as the well region for N-channel field-effect transistor (NFET) 209. Also, CMOS P well 210 can be utilized as a collector sinker for PNP device 207 in PNP region 204b.

CMOS N well 208 in NPN region 204a and other CMOS N wells in CMOS region 202 (not explicitly shown in FIG. 2A) can be formed by utilizing a well mask to define respective portions of semiconductor substrate 201 in NPN region 204a and CMOS region 202, and implanting phosphorus or other appropriate N type dopant in the defined portions of semiconductor substrate 201. CMOS N well 208 in NPN region 204a can be formed at the same time, using the same well mask and using the same type dopant, as other CMOS N wells in CMOS region 202. In one implementation, CMOS N well 208 may include a heavily doped N type implant. As discussed below, CMOS N well 208 can be utilized as a collector sinker for NPN device 205 in NPN region 204a.

As illustrated in FIG. 2A, CMOS P well 206 and CMOS N well 208 form p-n junction 246 to provide electrical isolation between NFET 209 and NPN device 205. Since p-n junction 246 provides electrical isolation between CMOS P well 206 and CMOS N well 208, additional isolations structures, such as deep trench isolation structures, are not required between NFET 209 and NPN device 205, thereby saving usable space on semiconductor substrate 201 and reducing manufacturing cost. In another implementation, CMOS P well 206 may be spaced apart from CMOS N well 208 to provide electrical isolation between NFET 209 and NPN device 205.

Although FIG. 2A illustrates the formations of CMOS P well 206, CMOS N well 208, CMOS P well 210, it should be understood that additional CMOS wells (not shown in FIG. 2A) can also be formed in both CMOS region 202 and bipolar region 204 of semiconductor substrate 201. For example, another CMOS N well can be formed in semiconductor substrate 201 adjacent to CMOS P well 206, where the CMOS N well and the CMOS P well can be utilized to respectively form a P-channel field-effect transistor (PFET) and an NFET (e.g., NFET 209) of a CMOS device.

Referring to FIG. 2B, structure 282 illustrates a cross-sectional view of a portion of a semiconductor device after completion of action 182 in flowchart 100 of FIG. 1, according to one implementation of the present disclosure. As illustrated in FIG. 2B, structure 282 includes gate electrode 211, lightly doped source region 213a, lightly doped drain region 213b, common spacer oxide layer 212 and common spacer nitride layer 214. In structure 282, gate electrode 211 of NFET 209 is formed over CMOS P well 206. An oxide layer may be formed between gate electrode 211 and CMOS P well 206. Lightly doped source region 213a and lightly doped drain region 213b may be formed in CMOS P well 206 adjacent to gate electrode 211. For example, lightly doped source region 213a and lightly doped drain region 213b may include lightly doped N type dopant. Common spacer oxide layer 212 and common spacer nitride layer 214 are successively formed on top surface 218 of semiconductor substrate 201 in CMOS region 202 and bipolar region 204. Common spacer oxide layer 212 can include tetraethylorthosilicate ("TEOS") oxide. Common spacer nitride layer 214 can include silicon nitride. Common spacer oxide layer 212 and/or common spacer nitride layer 214 can be formed over CMOS region 202 and bipolar region 204 of semiconductor substrate 201 by using a chemical vapor deposition ("CVD") process or other appropriate processes. As shown in FIG. 2B, in CMOS region 202, common spacer oxide layer 212 and common spacer nitride layer 214 also cover gate electrode 211 of NFET 209.

Referring to FIG. 2C, structure 283 illustrates a cross-sectional view of a portion of a semiconductor device after completion of action 183 in flowchart 100 of FIG. 1, according to one implementation of the present disclosure. As shown in FIG. 2C, structure 283 includes spacer clear region 216, sub-collector 220 and selectively implanted collector (SIC) or collector 234 of PNP device 207 formed in spacer clear region 216. As illustrated in FIG. 2C, spacer clear masking layer 215 is formed over common spacer nitride layer 214 and patterned to define spacer clear region 216 in PNP region 204b for PNP device 207. Spacer clear masking layer 215 may include photoresist or other appropriate masking material. The portions of common spacer nitride layer 214 and common spacer oxide layer 212 not covered by spacer clear masking layer 215 are removed by, for example, using an etching process to expose top surface 218 of semiconductor substrate 201. High energy spacer clear implant 219, such as high energy boron dopant or other appropriate P type high energy dopant, is implanted in semiconductor substrate 201 through top surface 218 in spacer clear region 216, thereby forming sub-collector 220 of PNP device 207, while spacer clear masking layer 215 protects the rest of the semiconductor substrate. As spacer clear masking layer 215 is still in place, SIC 234 having a highly p-doped local collector implant, which is closer to an interface between the sub-collector and the base of PNP device 207, is also formed.

As further illustrated in FIG. 2C, the P type implant in CMOS P well 210 in PNP region 204b may be utilized as the extrinsic collector contact implant for PNP device 207. As such, CMOS P well 210 operates as collector sinker 224 for PNP device 207. Sub-collector 220, having high energy spacer clear implant 219, and collector sinker 224, having a heavily doped P type implant, may be in direct physical contact with and electrically connected to each other in overlapped region 222. Sub-collector 220 and collector sinker 224 may have substantially the same depth below top surface 218 in semiconductor substrate 201. Sub-collector 220 and collector sinker 224 form a direct electrical path for external connection for sub-collector 220 of PNP device 207. As such, a buried sub-collector layer in a conventional process flow can be avoided in PNP device 207. Consequently, masking layers required for forming the buried sub-collector layer and the associated implanting actions are also avoided.

Referring to FIG. 2D, structure 284 illustrates a cross-sectional view of a portion of a semiconductor device after completion of action 184 in flowchart 100 of FIG. 1, according to one implementation of the present disclosure. As shown in FIG. 2D, structure 284 includes N type SiGe layer 226 formed on top surface 218 of semiconductor substrate 201 in spacer clear region 216 and on common spacer nitride layer 214 over other regions of semiconductor substrate 201. As illustrated in FIG. 2D, after spacer clear masking layer 215 is removed, N type SiGe layer 226 is formed over CMOS region 202 and bipolar region 204 of semiconductor substrate 201, including spacer clear region 216. In the present implementation, N type SiGe layer 226 may be epitaxially grown over the exposed top surface 218 of semiconductor substrate 201 in spacer clear region 216. N type SiGe layer 226 forms a base for PNP device 207 in spacer clear region 216. In another implementation, N type SiGe layer 226 may have a graded structure. For example, grading the concentration of germanium in a silicon-germanium base builds into a bipolar device an electric field, which accelerates the carriers across the base, thereby increasing the speed of the heterojunction bipolar device compared to a silicon-only device. For example, a reduced pressure chemical vapor deposition technique, or RPCVD, may be used to fabricate a controlled grading of germanium concentration across the base layer.

It is noted that, up to action 184 of flowchart 100, the formation of sub-collector 220 and N type SiGe layer 226 as the base for PNP device 207 can be interchanged with the formation of a sub-collector and a base for NPN device 205, by implanting dopants with reversed polarities in each of corresponding regions. For example, instead of forming sub-collector 220 and N type SiGe layer 226 for PNP device 207, a spacer clear region may be formed in NPN device 205, a vertical NPN collector implant may be performed, and a P type SiGe layer may be deposited over semiconductor substrate 201 to form a P type SiGe base for NPN device 205.

Referring to FIG. 2E, structure 285 illustrates a cross-sectional view of a portion of a semiconductor device after completion of action 185 in flowchart 100 of FIG. 1, according to one implementation of the present disclosure. As shown in FIG. 2E, structure 285 includes PNP emitter window 232 formed above SIC 234 of PNP device 207 in PNP region 204b. As illustrated in FIG. 2E, PNP base oxide layer 228 and undoped furnace poly layer 230 are formed over N type SiGe layer 226 covering an entire top surface thereof. PNP emitter window 232 is formed in undoped furnace poly layer 230 and PNP base oxide layer 228, and aligned with SIC 234 below. In one implementation, PNP emitter window 232 can be formed by depositing a mask over undoped furnace poly layer 230 to define an emitter window opening above SIC 234, and removing portions of undoped furnace poly layer 230 and PNP base oxide layer 228 by using an appropriate etching process to extend the emitter window opening to a top surface N type SiGe layer 226. In another implementation, PNP emitter window 232 may extend to a top surface of PNP base oxide layer 228. In one implementation, an optional organic antireflection coating layer (not explicitly shown in FIG. 2E) may be formed over undoped furnace poly layer 230 before the formation of PNP emitter window 232. The organic antireflection coating layer may enhance photolithographic control over the formation of PNP emitter window 232, and may be removed before any further processing action.

Referring to FIG. 2F, structure 286 illustrates a cross-sectional view of a portion of a semiconductor device after completion of action 186 in flowchart 100 of FIG. 1, according to one implementation of the present disclosure. As shown in FIG. 2F, structure 286 includes spacer clear region 238, sub-collector 240 and selectively implanted collector (SIC) or collector 244 in NPN region 204a for NPN device 205. As illustrated in FIG. 2F, spacer clear masking layer 236 is formed over undoped furnace poly layer 230 to define spacer clear region 238 in NPN region 204a for NPN device 205. Spacer clear masking layer 236 may include photoresist or other appropriate masking material. The portions of undoped furnace poly layer 230, PNP base oxide layer 228, N type SiGe layer 226, common spacer nitride layer 214 and common spacer oxide layer 212 not covered by spacer clear masking layer 236 are removed by, for example, using an etching process to expose a portion of top surface 218 of semiconductor substrate 201 in spacer clear region 238. High energy spacer clear implant 239, such as high energy phosphorous dopant or other appropriate N type high energy dopant, is implanted in semiconductor substrate 201 in spacer clear region 238, thereby forming sub-collector 240 of NPN device 205. While spacer clear masking layer 236 is still on the semiconductor substrate, SIC 244 having a highly N-doped local collector implant, which is closer to an interface between the sub-collector and the base of NPN device 205, is also formed.

As further illustrated in FIG. 2F, the N type implant in CMOS N well 208 in NPN region 204a may be utilized as the extrinsic collector contact implant for NPN device 205. As such, CMOS N well 208 operates as collector sinker 248 for NPN device 205. Sub-collector 240 for NPN device 205 is spaced from and electrically insulated from collector sinker 224 of PNP device 207. On an opposite side, sub-collector 240 having high energy spacer clear implant 239 and collector sinker 248 having a heavily doped N type implant, may be in direct physical contact with and electrically connected to each other with each other in overlapped region 242. Sub-collector 240 and collector sinker 248 may have substantially the same depth below top surface 218 in semiconductor substrate 201. Sub-collector 240 and collector sinker 248 form a direct electrical path for external connection for sub-collector 240 of NPN device 205. As such, a buried sub-collector layer in a conventional process flow can be avoided in NPN device 205. Consequently, masking layers required for forming the buried sub-collector layer and the associated implanting actions are also avoided.

Referring to FIG. 2G, structure 287 illustrates a cross-sectional view of a portion of a semiconductor device after completion of action 187 in flowchart 100 of FIG. 1, according to one implementation of the present disclosure. As shown in FIG. 2G, structure 287 includes NFET 209 in CMOS region 202, NPN device 205 in NPN region 204a, and PNP device 207 in PNP region 204b. Specifically, P type base 250a and N type emitter 258a of NPN device 205, P type SiGe emitter 250b of PNP device 207, and source region 274a and drain region 274b of NFET 209 are formed in action 187.

As illustrated in FIG. 2G, NFET 209 includes CMOS P well 206, gate electrode 211, common spacer oxide layer 212, spacers 214a and 214b, lightly doped source region 213a, lightly doped drain region 213b, source region 274a, and drain region 274b. CMOS P well 206 is situated between isolation regions 203a and 203b in CMOS region 202. Gate electrode 211 is situated over CMOS P well 206 on common spacer oxide layer 212 in CMOS region 202. For example, gate electrode 211 includes polycrystalline silicon. Spacers 214a and 214b are situated adjacent to gate electrode 211 and over CMOS P well 206 in CMOS region 202. In the present implementation, spacers 214a and 214b include silicon nitride.

In other implementations, spacer 214a and 214b can include silicon oxide or other appropriate dielectric material. Spacer 214a and 214b can be formed by depositing a conformal common spacer layer, such as a silicon oxide and/or silicon nitride layer, over CMOS region 202 and bipolar region 204 of semiconductor substrate 201. The layer of dielectric material can then be etched back using an anisotropic etching process to form spacers 214a and 214b. Lightly doped source region 213a and lightly doped drain region 213b are formed adjacent to gate electrode 211 in CMOS P well 206 in CMOS region 202. Lightly doped source region 213a and lightly doped drain region 213b include lightly doped N type regions. Source region 274a and drain region 274b are formed in CMOS region 202 of semiconductor substrate 201. Source region 274a is situated in CMOS P well 206 between isolation region 203a and lightly doped source region 213a. Drain region 274b is situated in CMOS P well 206 between isolation region 203b and lightly doped drain region 213b.

As illustrated in FIG. 2G, NPN device 205 includes N type emitter 258a, NPN emitter spacers 270a and 270b, P type base 250a, SIC 244, N type sub-collector 240, collector sinker 248 and collector contact 275a. In the present implementation, NPN device 205 is a vertical heterojunction bipolar transistor. N type emitter 258a is situated between NPN emitter spacers 270a and 270b and over P type base 250a in NPN region 204a. N type emitter 258a can include N type polycrystalline silicon, which can be doped with phosphorus or other appropriate N type dopant. Heavily doped extrinsic base regions 264a and 264b are situated in P type base 250a adjacent to N type emitter 258a in semiconductor substrate 201 in NPN region 204a. Sub-collector 240 and SIC 244 of NPN device 205 are formed in NPN region 204a.

As illustrated in FIG. 2G, sub-collector 240 and collector sinker 248 may have substantially the same depth below top surface 218 in semiconductor substrate 201. Sub-collector 240 having an N type high energy spacer clear implant partially overlaps collector sinker 248 having heavily doped N type implant in overlapped region 242. Sub-collector 240 and collector sinker 248 form a direct electrical path for external connection using collector contact 275a of NPN device 205. In the present implementation, CMOS P well 206 for NFET 209 and collector sinker 248 formed using CMOS N well 208 form p-n junction 246 in semiconductor substrate 201, where p-n junction 246 provides electrical isolation between NFET 209 and NPN device 205 in semiconductor substrate 201. As such, CMOS P well 206 for NFET 209 and collector sinker 248 of NPN device 205 need not be placed apart from each other, thereby saving usable space on semiconductor substrate 201.

As illustrated in FIG. 2G, PNP device 207 includes P type SiGe emitter 250b, PNP emitter spacers 270c and 270d, N type SiGe base 226a, SIC 234, P type sub-collector 220, collector sinker 224 and collector contact 275b. In the present implementation, PNP device 207 is a vertical heterojunction bipolar transistor. P type SiGe emitter 250b is situated between PNP emitter spacers 270c and 270d and over N type SiGe base 226a in PNP region 204b. Heavily doped extrinsic base regions 269a and 269b are situated in N type SiGe base 226a adjacent to P type SiGe emitter 250b in PNP region 204b. Sub-collector 220 and SIC 234 of PNP device 207 are formed in PNP region 204b.

As illustrated in FIG. 2G, sub-collector 220 and collector sinker 224 may have substantially the same depth below top surface 218 in semiconductor substrate 201. Sub-collector 220 having a P type high energy spacer clear implant partially overlaps collector sinker 224 having a heavily doped P type implant in overlapped region 222. Sub-collector 220 and collector sinker 224 form a direct electrical path for external connection using collector contact 275b of PNP device 207. In the present implementation, collector sinker 224 of PNP device 207 and sub-collector 240 of NPN device 205 are spaced apart from each other to provide electrical isolation between PNP device 207 and NPN device 205. In another implementation, collector sinker 224 of PNP device 207 and sub-collector 240 of NPN device 205 may be placed immediately adjacent to each other.

Although FIGS. 2A-2G illustrate the formations of CMOS P well 206, CMOS N well 208, CMOS P well 210, NFET 209, NPN device 205 and PNP device 207 in the present implementation, it should be understood that, in another implementation according to the present inventive concepts, the above-mentioned regions can be interchanged with the formations of a CMOS N well, CMOS P well, CMOS N well, a PFET, a PNP device and an NPN device, by implanting dopants with reversed polarities in each of the corresponding regions.

Thus, the present inventive concepts utilize CMOS N and P wells in a bipolar region of a semiconductor substrate as collector sinkers for complementary bipolar devices, where each of the collector sinkers is connected to a sub-collector, having a high energy implant, for a respective bipolar device in the same semiconductor substrate. The advantages of the present inventive concepts may include reduced cost of fabrication due to the shared well implants, the elimination of one or more process steps related to conventional buried sub-collector layer fabrication and isolation structures, and reduced collector resistance.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described above, but many rearrangements, modifications, and substitutions are possible without departing from the scope of the present disclosure.

The invention claimed is:

1. A bipolar complementary-metal-oxide-semiconductor (BiCMOS) device comprising:
   a CMOS device in a CMOS region of a substrate;
   a first well in said CMOS region;
   an NPN bipolar device in a bipolar region of said substrate;
   a second well in said bipolar region;
   a sub-collector of said NPN bipolar device reaching a top surface of said substrate, said sub-collector surrounding a selectively implanted collector;
   said second well being a collector sinker, said collector sinker being laterally adjacent and electrically connected to said sub-collector of said NPN bipolar device in a laterally overlapping region;
   wherein said first well in said CMOS region and said collector sinker in said bipolar region form a p-n junction to provide electrical isolation between said CMOS device and said NPN bipolar device;
   said collector sinker being electrically connected to a collector contact;
   said sub-collector not extending vertically below said collector sinker.

2. The BiCMOS device of claim 1, wherein said substrate is a P type silicon substrate.

3. The BiCMOS device of claim 1, further comprising a third well in said bipolar region, wherein said first well and said third well have the same conductivity type.

4. The BiCMOS device of claim 1, further comprising a PNP bipolar device having a sub-collector, said sub-collector of said PNP bipolar device being electrically connected to a third well in said bipolar region.

5. The BiCMOS device of claim 4, wherein said third well is a collector sinker for said PNP bipolar device.

6. The BiCMOS device of claim 4, wherein said PNP bipolar device comprises a base over said sub-collector of said PNP bipolar device, said base of said PNP bipolar device comprising silicon germanium (SiGe).

7. The BiCMOS device of claim 4, wherein said third well is a P well.

8. The BiCMOS device of claim 1, wherein said CMOS device is an N-channel field-effect transistor (NFET).

9. The BiCMOS device of claim 1, wherein said first well is a P well, and said collector sinker is an N well.

10. A bipolar complementary-metal-oxide-semiconductor (BiCMOS) device comprising:
    a CMOS device in a CMOS region of a substrate;
    a first well in said CMOS region;
    an NPN bipolar device in a bipolar region of said substrate;
    a second well in said bipolar region;
    a sub-collector of said NPN bipolar device reaching a top surface of said substrate, said sub-collector surrounding a selectively implanted collector;
    said second well being laterally adjacent and electrically connected to said sub-collector of said NPN bipolar device in a laterally overlapping region;
    wherein said first well in said CMOS region and said second well in said bipolar region form a p-n junction to provide electrical isolation between said CMOS device and said NPN bipolar device;
    said second well being electrically connected to a collector contact;
    said sub-collector not extending vertically below said second well.

11. The BiCMOS device of claim 10, wherein said substrate is a P type silicon substrate.

12. The BiCMOS device of claim 10, further comprising a third well in said bipolar region, wherein said first well and said third well have the same conductivity type.

13. The BiCMOS device of claim 10, further comprising a PNP bipolar device having a sub-collector, said sub-collector of said PNP bipolar device being electrically connected to a third well in said bipolar region.

14. The BiCMOS device of claim 13, wherein said third well is a collector sinker for said PNP bipolar device.

15. The BiCMOS device of claim 13, wherein said PNP bipolar device comprises a base over said sub-collector of said PNP bipolar device, said base of said PNP bipolar device comprising silicon germanium (SiGe).

16. The BiCMOS device of claim 13, wherein said third well is a P well.

17. The BiCMOS device of claim 10, wherein said CMOS device is an N-channel field-effect transistor (NFET).

18. The BiCMOS device of claim 10, wherein said first well is a P well, and said second well is an N well.

* * * * *